United States Patent
Oates et al.

(10) Patent No.: US 7,471,539 B2
(45) Date of Patent: Dec. 30, 2008

(54) HIGH CURRENT INTERCONNECT STRUCTURE FOR IC MEMORY DEVICE PROGRAMMING

(75) Inventors: Anthony Oates, Hsinchu (TW); Denny Tang, Saratoga, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 402 days.

(21) Appl. No.: 11/317,834

(22) Filed: Dec. 20, 2005

(65) Prior Publication Data

US 2007/0138511 A1 Jun. 21, 2007

(51) Int. Cl.
*G11C 11/00* (2006.01)
*G11C 5/08* (2006.01)
(52) U.S. Cl. .................................... 365/66; 365/158
(58) Field of Classification Search ............. 365/66, 365/158
See application file for complete search history.

(56) References Cited

U.S. PATENT DOCUMENTS

| | | | | |
|---|---|---|---|---|
| 6,424,561 | B1 * | 7/2002 | Li et al. ...................... | 365/158 |
| 6,909,629 | B2 * | 6/2005 | Theel ......................... | 365/158 |
| 6,940,749 | B2 * | 9/2005 | Tsang ......................... | 365/171 |
| 7,020,004 | B1 * | 3/2006 | Hurst et al. ................. | 365/130 |

* cited by examiner

*Primary Examiner*—Evan Pert (57) ABSTRACT

A method and system for a high current semiconductor memory cell provides a semiconductor memory cell with two current carrying structures. At least one of the current carrying structures is segmented and formed of narrow wire segments from one or more levels coupled to wider connective squares of another level. The wire segments may be a conductive material and the connective squares a refractory material. The short length wire segments may include a length less than the average grain size of the material of which they are formed.

20 Claims, 6 Drawing Sheets

HIGH CURRENT INTERCONNECT STRUCTURE FOR IC MEMORY DEVICE PROGRAMMING

BACKGROUND

The present invention relates generally to semiconductor memory device programming, and more particularly to the formation and implementation of high current interconnect structures for integrated circuit (IC) memory device programming.

Programmable semiconductor devices such as dynamic random access memory (DRAM), flash memory, and particularly magnetic random access memory (MRAM), typically require large current pulses to properly program these devices. Wide interconnect lines are required to carry large currents for programming these memory devices. Previously, the large width lines did not present an issue with the semiconductor geometries. However, today's increasingly smaller geometries entering into the sub-micron region are forcing designers to investigate every aspect of the IC design to achieve these smaller and smaller geometries. This investigation also includes the wide interconnect high current lines within an IC that are used for IC memory device programming. These wide interconnect lines are inhibiting the memory cell size reduction needed for smaller geometries. Thus, narrower (minimum) feature size interconnect lines must be incorporated into today's IC designs for memory programming without adversely affecting circuit reliability.

Although reducing the width of the high current programming lines in memory devices appears to be an easy solution, in reality the reduction of the interconnect line width beyond a point for a given current results in a phenomenon called "electro-migration", which adversely impacts the line reliability.

Electro-migration (EM) is the mass transport of a metal due to the momentum transfer between conducting electrons and diffusing metal atoms. A less complex definition of electro-migration is the drift of atoms under the influence of strong electron winds. Within ICs, current densities in metal lines, especially the high current programming lines, can attain huge values ($MA/cm^2$). The conventional method to obtain reliable circuits and avoid the high current densities is to provide sufficiently wide metal lines. However, the continual reduction of circuit geometries as presented above, eliminates this as a viable solution. The most common failure modes in metallic interconnections are related to EM. Early effects in electro-migration are resistance change and the evolution of mechanical stress in grains and regions of grain boundaries (cluster regions). The large stress gradients induce a piezo-resistive effect that in turn changes the line resistance. Two-dimensional simulations have shown that the critical length of a grain in which a mechanical stress gradient and diffusion force can still be built up will balance the electron wind force. This grain length, which negates the EM influence, is commonly known by those skilled in the art as the "Blech length" or "Short length". "Short length" lines (or grains) shorter than this length are considered "electro-migration hard". The "Short length" line length where EM effects are eliminated is typically less than 10 um for IC circuit structures. Electro-migration causes failures in microelectronic components by creating voids, which eventually cause open circuits and hillocks, thereby causing short circuits, depending upon the metallization geometry as well as the proximity of one metal line to another.

In state of the art metallization systems, EM becomes noticeable when current densities approach approximately $10^6$ $A/cm^2$. However, EM failures have been observed at much lower current densities, which indicate serious reliability problems. As semiconductor device features are reduced further, current densities increase with the metallization layer complexity. Therefore, it is essential to reduce/eliminate the EM induced failure mode in today's sub-micron designs to attain the maximum circuit reliability. The high current programming lines of semiconductor memory devices are particularly vulnerable to EM effects.

Therefore, desirable in the art of IC memory device programming are improved high current interconnect structures that eliminate the electro-migration effects due to the high current densities for these IC memory devices.

SUMMARY

In view of the foregoing, this invention provides circuit structures and methods to improve integrated circuit memory device (DRAM, Flash, MRAM, etc.) programming performance and device reliability through the incorporation of a new "short length" high current interconnect structure.

In a first embodiment of this invention, a new "short length" high current interconnect single plane structure for a MRAM device is presented. In a second embodiment of this invention, a new "short length" high current interconnect multiple plane structure for a MRAM device is presented. The use of this "short length" high current interconnect structure enables the use of narrow (minimum) feature size conductor widths, which permits cell size reduction and lower costs, without compromising circuit reliability (eliminates EM effects) and memory cell performance.

The construction and method of operation of the invention, however, together with additional objects and advantages thereof will be best understood from the following description of specific embodiments when read in connection with the accompanying drawings.

DESCRIPTION

The following will provide a detailed description of a plurality of structures with a new "short length" high current interconnect, which provides improved IC programming performance and reliability.

Figures 1A, 1B:
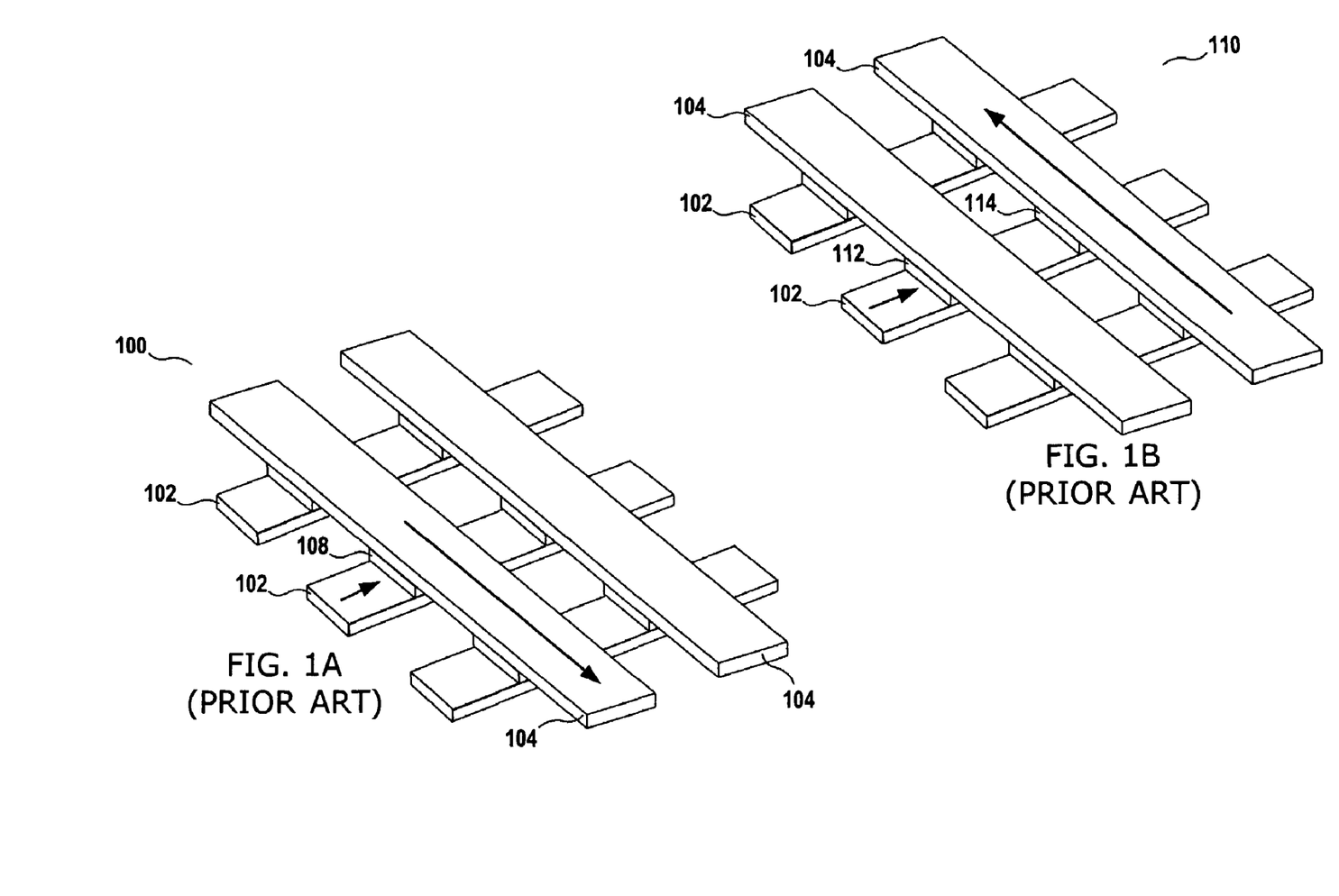
FIGS. 1A and 1B present two typical magnetic random access memory cell layouts.

FIGS. 1A and 1B present two typical MRAM (magnetic random access memory) cell layouts 100 and 110. A MRAM device is a non-volatile memory. Unlike DRAM chips, the data does not require continuous refreshing as the programming is accomplished using high currents. MRAM devices are expected to replace DRAM and flash memory devices in the future due to their extremely low power consumption.

The MRAM cell layout 100 is comprised of intersecting word lines (rows) and bit lines (columns). MRAM memory cells are created at the intersections where the word lines and bit lines intersect. The principle governing the operation of the memory cells in MRAMs is the change of resistivity of certain materials and film structures in the presence of a magnetic field (magneto-resistance). In a MRAM device, cells are programmed using two programming currents flowing through two orthogonal lines (word line 102 and bit line 104). For example, a MRAM cell 108 is created at the intersection of the world line 102 and bit line 104. The applied magnetic field is in the longitudinal direction of the cell, due to the word line current, which is usually the magnetic anisotropy axis, but is below the switching threshold of the cells. Thus, the longitudinal field alone does not switch the cells. The transverse field generated by the bit line current lowers the switching threshold of the longitudinal field so that a cell that lies at the intersection of two orthogonally activated lines can switch, while half-selected cells on the same word or bit programming lines do not. Therefore, MRAM cells are programmed by passing high currents above and below the MRAM cell. Prior art MRAM cell programming currents are limited by the electro-migration limits of the interconnect lines. The MRAM cell layout 100 shows the reading of a bit from the MRAM cell 108, while the MRAM cell layout 110 shows the writing of a "1" to a cell 114.

Figure 2:
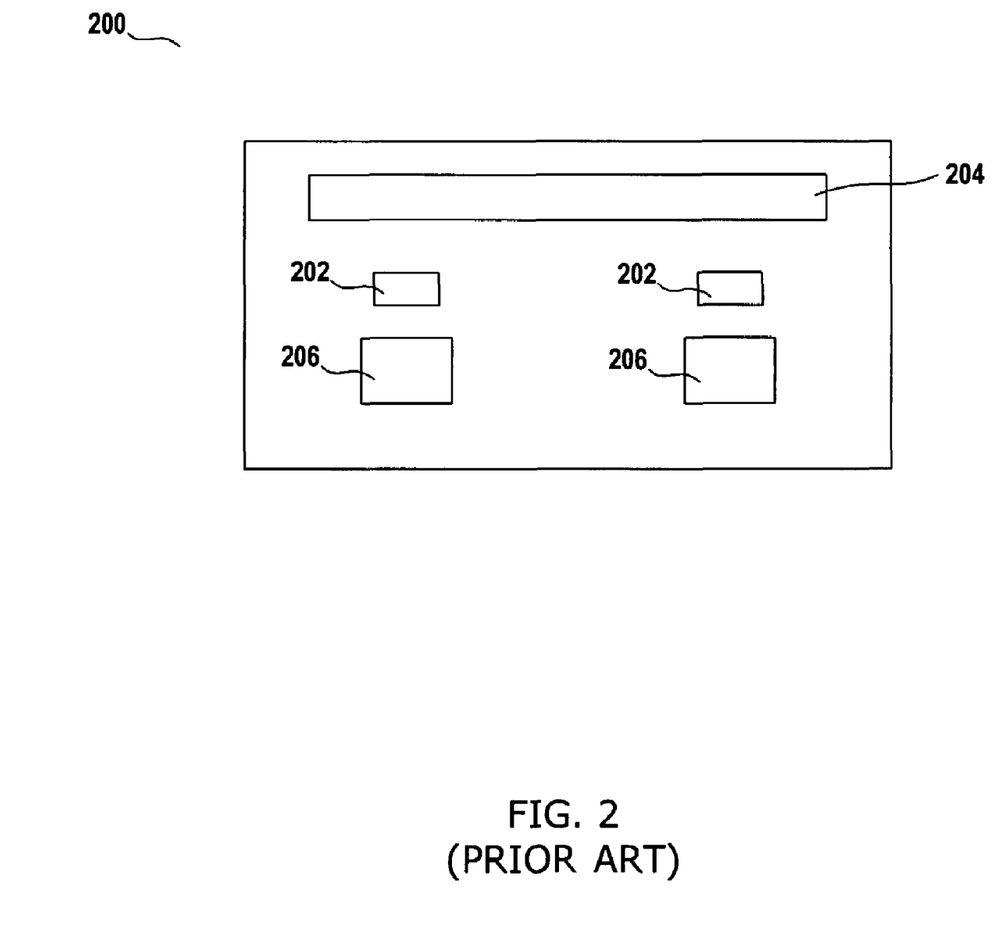
FIG. 2 presents a conventional MRAM cell layout cross-sectional view.

FIG. 2 presents a cross-sectional view of a conventional MRAM cell layout 200. This view shows two programmable single bit memory cells 202 with the bit line 204 above and the word line 206 below the memory cells 202. MRAM cells are programmed by passing high currents above and below the MRAM cell. In a conventional MRAM cell, the high current bit lines 204 and word lines 206 must be large width copper or aluminum lines to mitigate the electro-migration effects. These wide interconnect lines inhibit the memory cell size reduction needed for smaller geometries. Therefore improved high current interconnect structures are needed to eliminate the electro-migration effects due to the high current densities for these IC memory devices and thus permit reduced memory cell geometries. The present invention provides such a structure—the "short length" structure.

Figure 3:
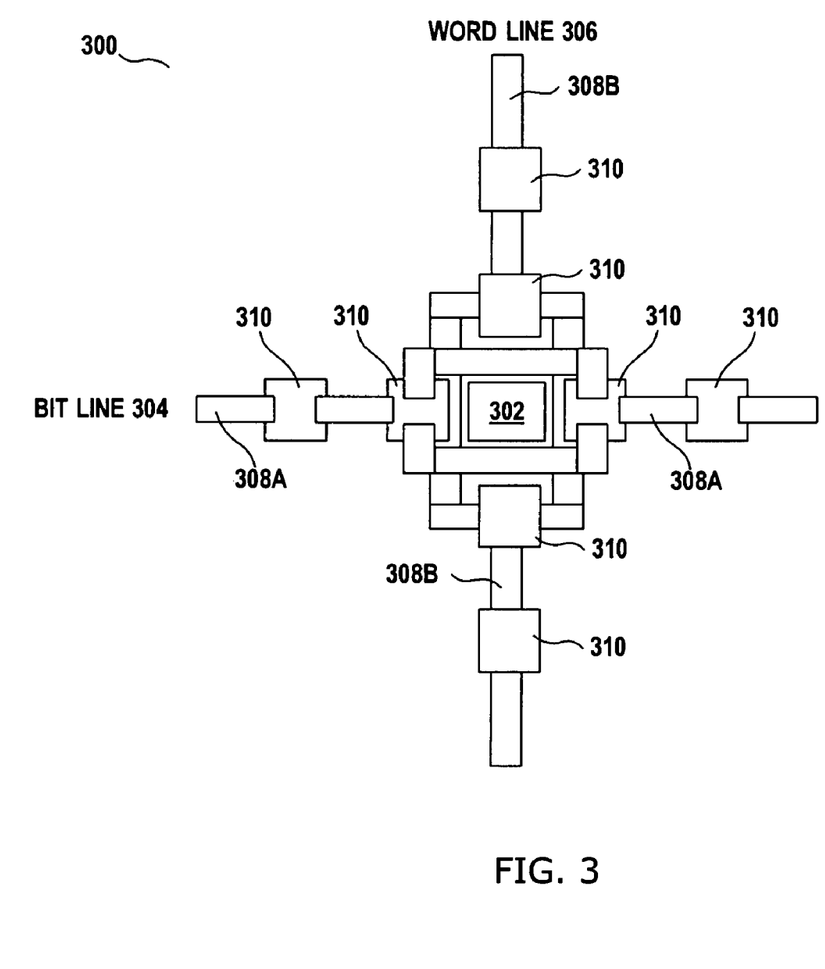
FIG. 3 presents a "short length" high current single planar interconnect structure in a MRAM cell in accordance with the first embodiment of this invention.

FIG. 3 presents a top view of the "short length" high current single plane interconnect structure MRAM cell layout 300 in accordance with the first embodiment of the present invention. A single bit memory cell 302 may be an MRAM and a bit line 304 is fabricated above the memory cell 302, while a word line 306 is fabricated below the memory cell 302, such that the lines intersect at the memory cell 302. Each of the bit line and the word line is a segmented current carrying structure. In a conventional MRAM cell, the bit lines and word lines are continuous wide copper or aluminum interconnect lines due to the high programming currents required for MRAM cells. This is required to prevent EM effects from degrading the cell reliability. The "short length" high current single plane interconnect structure presented in this embodiment utilizes multiple short wire segments 308A and 308B composed of Cu, Al, PtMn, or CoFe (and combinations thereof) which may be 0.5 to 3.0 micron in length and 0.2-2 micron in width, with a planar square 310 serving as a metal connecting structure, between each short wire segment. The wire segments 308A and 308B may advantageously have a length less than the average grain size of the metal material of which they are formed. In this example, the bit line wire segments 308A all reside in one plane are formed from one metal layer and the word line wire segments 308B all reside in another plane and are formed from one metal layer. A single plane square 310 (planar square) is utilized for the wire segment interconnections. These planar squares 310 are composed of a material different from that of the wire segments 308A and 308B. Typically, a refractory material such as Ta, TaN, or W is used to form squares 310 but other materials such as Cu may be used alternatively. When the wire segment 308A and 308B and the planar square 310 deposits are formed during fabrication, an electrical connection between the materials is formed, thus forming a continuous electrical line connection. This "short length" interconnect structure eliminates the EM effects while allowing for narrow (minimum) interconnect lines that are needed for reduced geometry MRAM designs. In this embodiment, the bit line 304 and the word line 306 are comprised of multiple short wire segments 308A and 308B, respectively, connected together by the planar squares 310 for the full length of the lines. The planar squares 310 may be formed of one level and include planar squares 310 connected superjacently to wire segments 308A and subjacently to wire segments 308B. Thus, high currents can be applied to these "short length" lines for programming without the typical electro-migration effects that can adversely affect integrated circuit reliability in conventional MRAM memory cell designs. This embodiment is a single plane design, since the wire segments 308A connected to planar square 310 are all in the same plane. Wire segments 308B are also all in the same plane and connected to other planar squares 310. It can be seen that the two centrally illustrated segments 308A extend laterally with respect to the memory cell 302. As will be shown in FIG. 5, multiple planes and multiple metal layers may be utilized for the bond connections in other embodiments. Although the wire segment width is reduced from a conventional design, since the wire capacitance remains essentially unchanged, the circuit drivers need not be increased.

Figure 4:
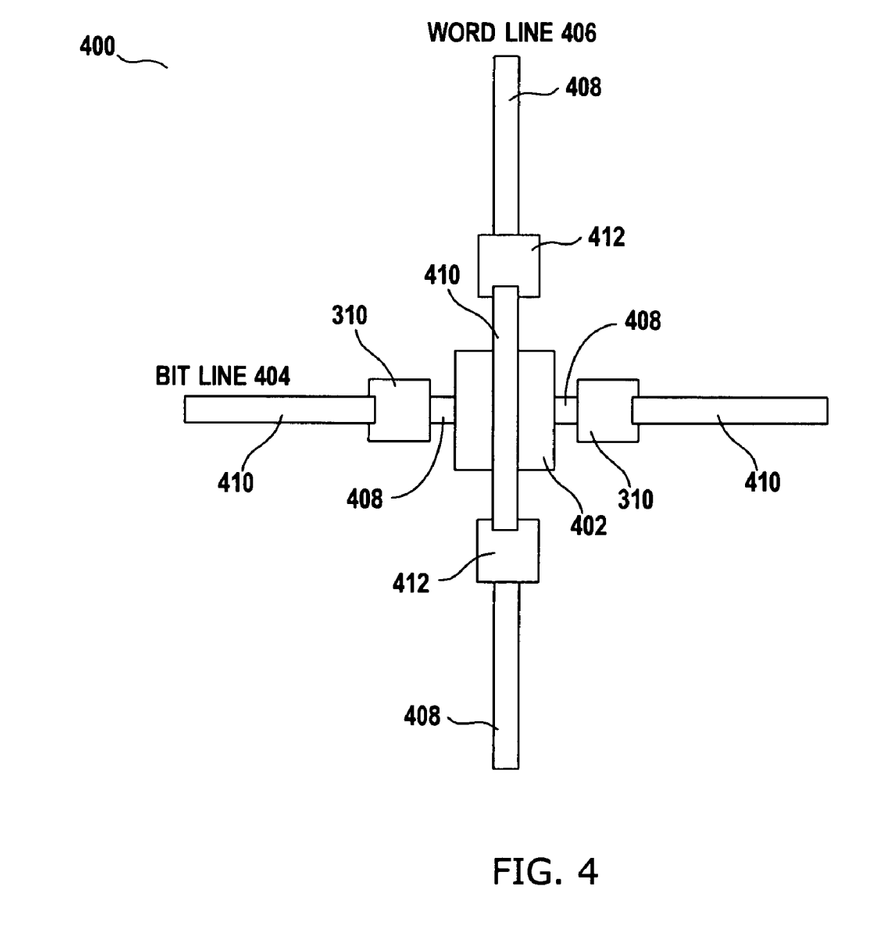
FIG. 4 presents a "short length" high current multi-plane interconnect structure in a MRAM cell in accordance with the second embodiment of this invention.

FIG. 4 presents a top view of the "short length" high current multiple plane interconnect structure MRAM cell layout 400 in accordance with a second embodiment of this invention. The single bit memory cell 402 may be an MRAM and has a bit line 404 that extends above a memory cell 402 and a word line 406 that extends below the memory cell 402, such that the lines intersect at the memory cell 402.

This embodiment implements the "short length" high current interconnect structure on the same layer (plane) as well as multiple metal layers. For example, bit line 404 is formed of line segments 408 from one metal layer formed on one plane and line segments 410 from another metal layer formed on another plane. Similarly, word line 406 is formed of line segments 410 from one metal layer formed on one plane, and line segments 408 from another metal layer formed on another plane. Moreover, an additional metal connect square type in addition to the planar square 310 of FIG. 3 may be used for the multiple layer interconnects. In layout 400, the short wire segments 408 (used in both word line 406 and bit line 404) are contained in the Mn layer, while the short wire segments 410 are contained in the Mn+1 layer. The bit line 404 and the word line 406 are composed of short wire segments that may be connected together by squares 310 and 412. The planar squares may connect line segments formed in the same plane (as described in FIG. 3) or from multiple planes, such as wire segments 410 and wire segments 408. Planar squares 310 and squares 412 may be formed on the same plane from a single layer of refractory material or they may be formed on different planes from different layers of refractory material if multiple layers of metal are to be interconnected. When the wire segments to be connected are on different layers, such as Mn and Mn+1, or Mn and Mn−1, the multi-plane square 412 may be utilized. In this embodiment, the bit line transitions from line segment 408 on the Mn layer, to the wire segment 410 on the Mn+1 layer to go under the memory cell 402, and then back to the line segment 408 on the Mn layer. Also, the word line transitions from line segment 410 on the Mn+1 layer to the wire segment 408 on the Mn layer to go across the bottom of the memory cell 402, and then back to the line segment 410 on the Mn+1 layer. Therefore, at these multi-plane transitions, the multi-plane square 412 is utilized. The multi-plane square 412 is composed of a refractory material, such as tungsten (W), tantalum or tantalum nitride. The multi-plane square 412 may be a standard via or a slot via to connect the short wire segments from one metal layer to another and in another embodiment, a standard via or a slot via may connect the wire segments 408 and 410 to the multi-plane square 412. In this example, the bit and word programming lines may be formed of Al short wire segments connected together with tungsten vias. The Al wire segments lengths may include a 2 um maximum length and the width less than 0.4 um but other widths and lengths may be used in other exemplary embodiments. When a slot via is used, its width may be approximately 0.26 um but other widths may be used in other exemplary embodiments. Also, the spacing between adjacent wire segments of adjacent cells may be around 1 um or less. The spacing between squares of adjacent cells may advantageously be less than 1 um. Although the wire segment width is reduced from a conventional design, the wire capacitance remains essentially unchanged, thus the circuit drivers do not need to be increased.

Figure 5A:
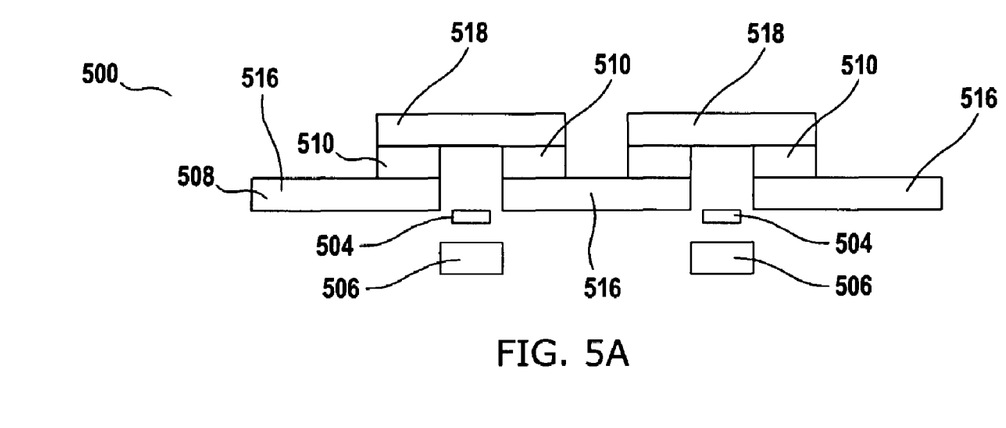
FIGS. 5A and 5B present two examples in accordance with the second embodiment of this invention.
Figure 5B:
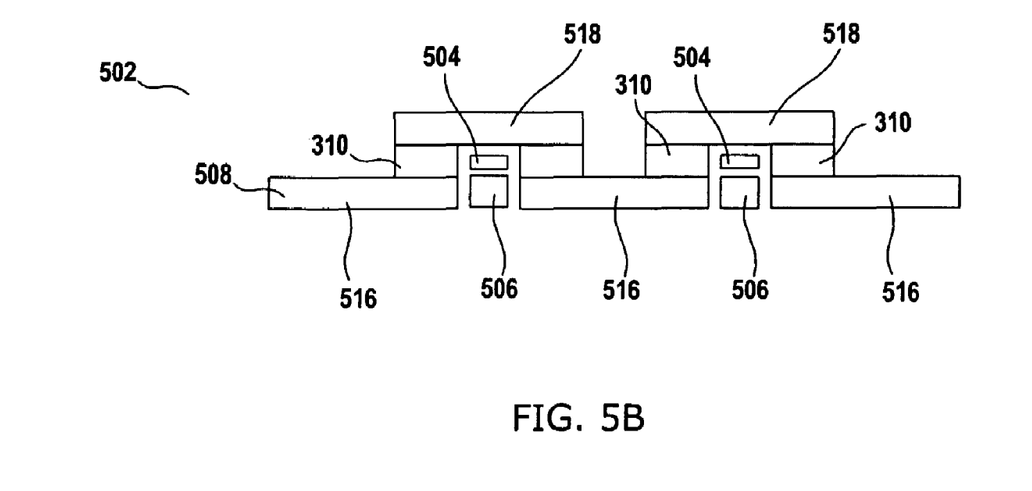

FIGS. 5A and 5B present two cross-sectional views 500 and 502 of an exemplary "short length" high current multiple plane interconnect structure MRAM cell layout. In the cross-sectional view 500, a memory cell 504 is traversed on the bottom by a word line 506 in the Mn−1 layer and on the top by a bit line 508. The bit line 508, in this example, includes segments 516 of the Mn layer and segments 518 of the Mn+1 metal layer. The segments are coupled by standard vias 510 which may be a multi-plane square 412 previously shown and described. Both the word line 506 and the bit line 508 continue to the next memory cell. Comparing with a conventional layout 200, while this example requires an additional metal layer, the additional benefits are provided, including the reduction of wire width, high current capability without EM effects, and potential for cell size reduction.

In the cross-sectional view 502 of FIG. 5B, the word line 506 is located in the Mn layer with the memory cell 504 between the bit line 508 and the word line 506. The bit line construction is identical to the cross-sectional view 500. This design is an improvement of the design in cross-sectional view 500 since it requires one less metal layer to implement and has the same benefits. Bit line 508 is formed of segments 516 from one layer of metal Mn and segments 518 from another layer of metal Mn+1. The respective segments are coupled by refractory square 310. Word line 506 is formed of the same metal layer as segments 516 in the Mn layer.

Figure 6A:
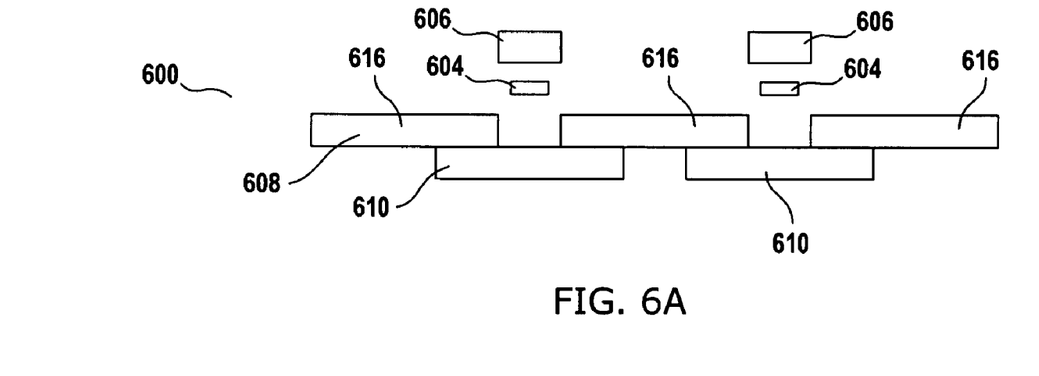
FIGS. 6A and 6B present two additional examples in accordance with the second embodiment of the present invention.

FIG. 6A presents an additional cross-sectional view 600 in accordance with another embodiment. The cross-sectional view 600 shows a two metal layer interconnect design. A memory cell 604 is traversed over top by a bit line 606 in the Mn+1 layer, and by a word line 608 in the Mn layer on the bottom. The word line wire segments 616 are formed of the Mn layer and are connected together by slot vias 610 made of tungsten or another refractory material. The slot via 610 may have a width of approximately 0.26 um in an exemplary embodiment but other lengths may be used alternatively.

Figure 6B:
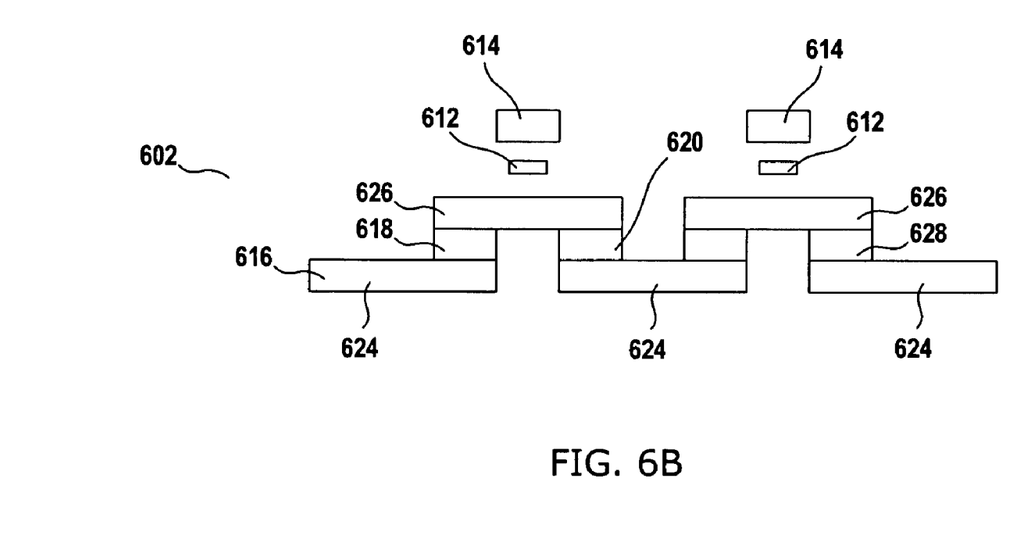

The cross-sectional view 602 of FIG. 6B utilizes three layers in this design with standard vias. A memory cell 612 is enclosed on the top by a bit line 614 in the Mn+1 layer and on the bottom by a word line 616 in the Mn and Mn−1 layers. The word line 616, in this example includes segments 624 in the Mn−1 metal layer connected to the segments 626 on the Mn layer by a standard via 618 to connect the two metal layers (planes). In this example, the via 618 may be multi-plane square 412 and is located below the memory cell 612. In this embodiment, each of the current carrying structures (word line 616 and bit line 614) is a segmented current carrying structure formed of a repeating sequence of first metal segments 624 in a first plane, refractory segments (vias 618) in a second plane, and third metal segments 626 in a third plane.

The above illustration provides many different embodiments or embodiments for implementing different features of the invention. Specific embodiments of components and processes are described to help clarify the invention. These are, of course, merely embodiments and are not intended to limit the invention from that described in the claims.

For example, FIG. 6B may alternatively represent metal line segments 626 coupled to refractory squares 624 through a via 628 which may be a refractory material or a conductive material.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor memory device programmable by a duality of current carrying structures passing in close proximity to a programmable memory cell, the semiconductor memory device comprising:
   the programmable memory cell and the duality of carrying structures; and
   at least one of the current carrying structures comprising a segmented current carrying structure comprising a plurality of first narrower line segments in a first plane coupled to a plurality of second wider line segments in a second plane, the wider line segments being wider than the narrower line segments.

2. The semiconductor memory device as in claim 1, wherein the first narrower line segments are formed of a first material and the second wider line segments are formed of a second material.

3. The semiconductor memory device as in claim 2, wherein the first material comprises Cu, Al, PtMn, or CoFe and the second material is a refractory material.

4. The semiconductor memory device as in claim 3, wherein the refractory material comprises Ta, TaN, or W.

5. The semiconductor memory device as in claim 1, wherein the programmable memory cell comprises an MRAM cell.

6. The semiconductor memory device as in claim 1, wherein the first narrower line segments are joined to the second wider line segments through vias formed of a refractory material and each of the first narrower line segments and the second wider line segments are formed of metal.

7. The semiconductor memory device as in claim 1, wherein the semiconductor memory device comprises two of the segmented current carrying structures, including a first current carrying structure including a first of the plurality of first narrower line segments formed of a first conductive layer and a first of the plurality of second wider line segments formed of a first refractory layer, and a second current carrying structure including a second of the plurality of first narrower line segments formed of a second conductive layer and the plurality of second wider line segments formed of the first refractory layer.

8. The semiconductor memory device as in claim 1, wherein the segmented current carrying structure comprises a first current carrying structure including the plurality of first narrower line segments including line segments from a first metal layer on a first level and line segments from a second metal layer on a second plane.

9. The semiconductor memory device as in claim 8, wherein the line segments on the first metal layer and the second metal layer are connected through a connection layer on a third plane.

10. The semiconductor memory device as in claim 1, wherein the semiconductor memory device comprises a first current carrying structure that delivers programming current over the memory cell and a second current carrying structure that delivers programming current below the memory cell.

11. The semiconductor memory device as in claim 1, wherein the first narrower line segments have a width of less than about 0.4 microns.

12. The semiconductor memory device as in claim 1, wherein the first narrower line segments include a length of less than about 3 microns.

13. The semiconductor memory device as in claim 1, wherein the segmented current carrying structure comprises an alternating sequence of the first narrower line segments and the second wider line segments, the first narrower line segments spaced apart by a distance of about 1 micron.

14. The semiconductor memory device as in claim 1, wherein the semiconductor memory device includes a first current carrying structure that is a word line and a second current carrying structure that is a bit line.

15. A semiconductor memory device programmable by a duality of current carrying structures passing in close proximity to a programmable memory cell, the semiconductor memory device comprising:
the programmable memory cell and the duality of current carrying structures; and
at least one of the current carrying structures comprising a segmented current carrying structure comprising a plurality of first narrower line segments formed of a first material and coupled to a plurality of second wider line segments formed of a second material, the wider line segments being wider than the narrower line segments,
wherein a first of the duality current carrying structure passes above the memory cell while a second of the duality current carrying structure passes below the memory cell.

16. The semiconductor memory device as in claim 15, wherein the narrower line segments and the wider line segments are formed in different planes and the first current carrying structure is a word line and the second current carrying structure is a bit line.

17. The semiconductor memory device as in claim 15, wherein the first material is Cu, Al, PtMn, or CoFe and the second material is a refractory material.

18. An MRAM device programmable by a duality of current carrying structures passing in close proximity to an MRAM memory cell, the MRAM device comprising:
the MRAM memory cell; and
the duality of current carrying structures including a first current carrying structure that superjacently traverses the MRAM memory cell and a second current carrying structure that subjacently traverses the MRAM memory cell, each of the first and second current carrying structures passing in sufficiently close proximity to the MRAM memory cell to program the MRAM memory cell;
at least one of the current carrying structures comprising a segmented current carrying structure formed of a repeating sequence of first metal segments in a first plane, refractory segments in a second plane, and second metal segments in a third plane, the refractory segments being wider than each of the first metal segments and second metal segments.

19. The MRAM device as in claim 18, wherein the metal segments have a width of less than about 0.4 microns.

20. The semiconductor memory device as in claim 18, wherein the metal segments have a length of less than about 3 microns.

* * * * *